(12) United States Patent
Angell et al.

(10) Patent No.: US 6,323,732 B1
(45) Date of Patent: Nov. 27, 2001

(54) DIFFERENTIAL AMPLIFIERS HAVING β COMPENSATION BIASING CIRCUITS THEREIN

(75) Inventors: Christopher W. Angell; Antonio Montalvo, both of Raleigh, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/618,736

(22) Filed: Jul. 18, 2000

(51) Int. Cl.$^7$ .................................................. H03F 3/45
(52) U.S. Cl. .................. 330/261; 330/254; 330/256; 330/257
(58) Field of Search ............................ 330/254, 256, 330/257, 261, 300

(56) References Cited

U.S. PATENT DOCUMENTS

| | | | |
|---|---|---|---|
| 3,987,368 | * 10/1976 | Ahmed | 330/259 |
| 4,064,463 | * 12/1977 | Leidich | 330/257 |
| 4,929,909 | 5/1990 | Gilbert | 330/256 |
| 4,990,803 | 2/1991 | Gilbert | 307/492 |
| 6,163,215 | * 12/2000 | Shibata et al. | 330/254 |
| 6,252,458 | * 6/2001 | Shibata | 330/261 |

* cited by examiner

Primary Examiner—Robert Pascal
Assistant Examiner—Patricia T. Nguyen
(74) Attorney, Agent, or Firm—Myers Bigel Sibley & Sajovec

(57) ABSTRACT

Differential amplifiers include biasing circuits therein that can automatically account for process and/or temperature induced variations in β and thereby more uniformly maintain the voltage gain of the differential amplifier at a desired level. A differential amplifier is provided that comprises first and second bipolar transistors electrically coupled together as an emitter-coupled pair (ECP) and a biasing circuit that is electrically connected to first and second emitters of the first and second bipolar transistors, respectively. This biasing circuit includes a current mirror that sets a magnitude of an emitter bias current in the first emitter at a value proportional to $(\beta+Z+1)/(\beta+1)$, where β is the gain of the first bipolar transistor and $1 \leq Z \leq 2$. In this manner, the gain of the differential amplifier can be set at a level proportional to $(\beta^2+2\beta)/(\beta_2+2\beta+1)$ which is a relatively weak function of β, even for small β.

21 Claims, 6 Drawing Sheets

DIFFERENTIAL AMPLIFIERS HAVING β COMPENSATION BIASING CIRCUITS THEREIN

FIELD OF THE INVENTION

The present invention relates to integrated circuit devices, and more particularly to integrated amplifier circuits.

BACKGROUND OF THE INVENTION

The gain of conventional integrated amplifier circuits is typically influenced by changes in temperature and process variations that may occur during fabrication. For example, the gain of the bipolar emitter coupled pair (ECP) differential amplifier illustrated by FIG. 1 is typically a function of the beta ($\beta$) of the bipolar transistors therein. As understood by those skilled in the art, $\beta$ may be influenced significantly by changes in temperature and by variations in bipolar fabrication processes. The voltage gain ($A_v$) of the ECP differential amplifier of FIG. 1 is frequently expressed as:

$$A_v = \beta R_c I_e/(\beta+1)V_t \qquad (1)$$

where $V_t$ is the thermal voltage ($V_t = KT/q$). Equation (1) illustrates that the voltage gain is strongly dependent on the value of $\beta$ for relatively small $\beta$.

As illustrated by FIG. 2, a common technique for limiting fluctuations in the voltage gain of an ECP differential amplifier includes the use of a compensation resistor, $R_{comp}$, in a bipolar current mirror which generates the bias current $I_{bias}$. The inclusion of the compensation resistor provides some degree of beta compensation by increasing the voltage on the base of Q4 and thereby increasing the collector current in Q4. However, to provide adequate compensation, the size of $R_{comp}$ frequently has to be relatively large, which may increase the chip area required by the differential amplifier. Compensation resistors also typically have parameters that vary with temperature and such variations can also contribute to gain error. In addition, the bipolar transistors within the current mirror of FIG. 2 can consume relatively large amounts of power.

Attempts have also been made to substitute MOS devices for the bipolar devices of FIG. 2 in order to reduce power consumption requirements in current mirrors. For example, FIG. 3 illustrates a conventional ECP differential amplifier having a MOS-based current mirror therein that generates a bias current ($I_{bias}$) at a level equal to (N)(IREF), where IREF denotes a magnitude of a reference current provided by a fixed current source of conventional design and N designates the mirror gain (e.g., width of NMOS transistor M6 relative to the width of NMOS transistor M5). MOS-based current mirrors can provide additional benefits over bipolar-based current mirrors, including higher output impedance, lower compliance voltage and lower noise. MOS-based current mirrors may also require less decoupling capacitance and typically have improved scaling capability relative to bipolar-based current mirrors. Nonetheless, MOS-based current mirrors typically do not provide significant built-in compensation for $\beta$ variations and because of the high gate impedance of MOS transistors compensation resistors typically may not be used successfully.

Thus, notwithstanding the above-described circuits for biasing and compensating differential amplifiers, there continues to be a need for improved biasing circuits that can have low power consumption requirements and can provide excellent compensation for $\beta$ variations.

SUMMARY OF THE INVENTION

Preferred differential amplifier embodiments include biasing circuits therein that can automatically account for process and/or temperature induced variations in $\beta$ and thereby more uniformly maintain the voltage gain of the differential amplifier at a desired level. According to one preferred embodiment, a differential amplifier is provided that comprises first and second bipolar transistors electrically coupled together as an emitter-coupled pair (ECP) and a biasing circuit that is electrically connected to first and second emitters of the first and second bipolar transistors, respectively. This biasing circuit includes a current mirror that sets a magnitude of an emitter bias current in the first emitter at a value proportional to $(\beta+1+Z)/(\beta+1)$, where $\beta$ is the gain of the first bipolar transistor and $1 \leq Z \leq 2$. In this manner, the gain of the differential amplifier can be set at a level proportional to $(\beta^2+\beta(Z+1))/(\beta^2+2\beta+1)$ which is a relatively weak function of $\beta$, even for small $\beta$.

According to another preferred embodiment, a differential amplifier is provided that includes first and second bipolar transistors electrically coupled together as an emitter-coupled pair and first and second current sources that generate a first reference current ($IREF_1$) and a second reference current ($IREF_2$), respectively. First and second current mirrors are also provided. The first current mirror generates a compensation current having a magnitude proportional to $IREF_1/(\beta+1)$, where $\beta$ is the gain of the first bipolar transistor. The second current mirror, which is electrically connected to first and second emitters of the first and second bipolar transistors, sets a magnitude of an emitter bias current in the first emitter at a level proportional to $(IREF_2+(N1)(IREF_1/(\beta+1)))$, where N1 is a current gain of the first current mirror. To provide a preferred level of $\beta$ compensation, the magnitude of $(N1)(IREF_1)$ is preferably set at a level equal to $IREF_2$. Thus, $Z=1$, where $Z=(N1)(IREF1)/(IREF_2)$. These first and second current mirrors also operate to set a magnitude of an emitter bias current in the first emitter at a value proportional to $(\beta+2)/(\beta+1)$ when $Z=1$.

According to still another preferred embodiment, a differential amplifier is provided that comprises first and second bipolar transistors electrically coupled together as an emitter-coupled pair and a biasing circuit that is electrically connected to first and second emitters of the first and second bipolar transistors, respectively. The biasing circuit includes first and second current sources that generate a first reference current ($IREF_1$) and a second reference current ($IREF_2$), respectively. A pair of current mirrors are also provided. A first current mirror generates a compensation current having a magnitude proportional to $IREF_1$. A second current mirror is electrically connected to first and second emitters of the first and second bipolar transistors, respectively, and sets a magnitude of an emitter bias current in the first emitter at a level proportional to a sum of $IREF_2$ and a magnitude of the compensation current. The magnitude of the compensation current is preferably set at a level sufficient to achieve a magnitude of an emitter bias current in the first emitter at a value proportional to $(\beta+Z+1)/(\beta+1)$ when combined with $IREF_2$.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 4:
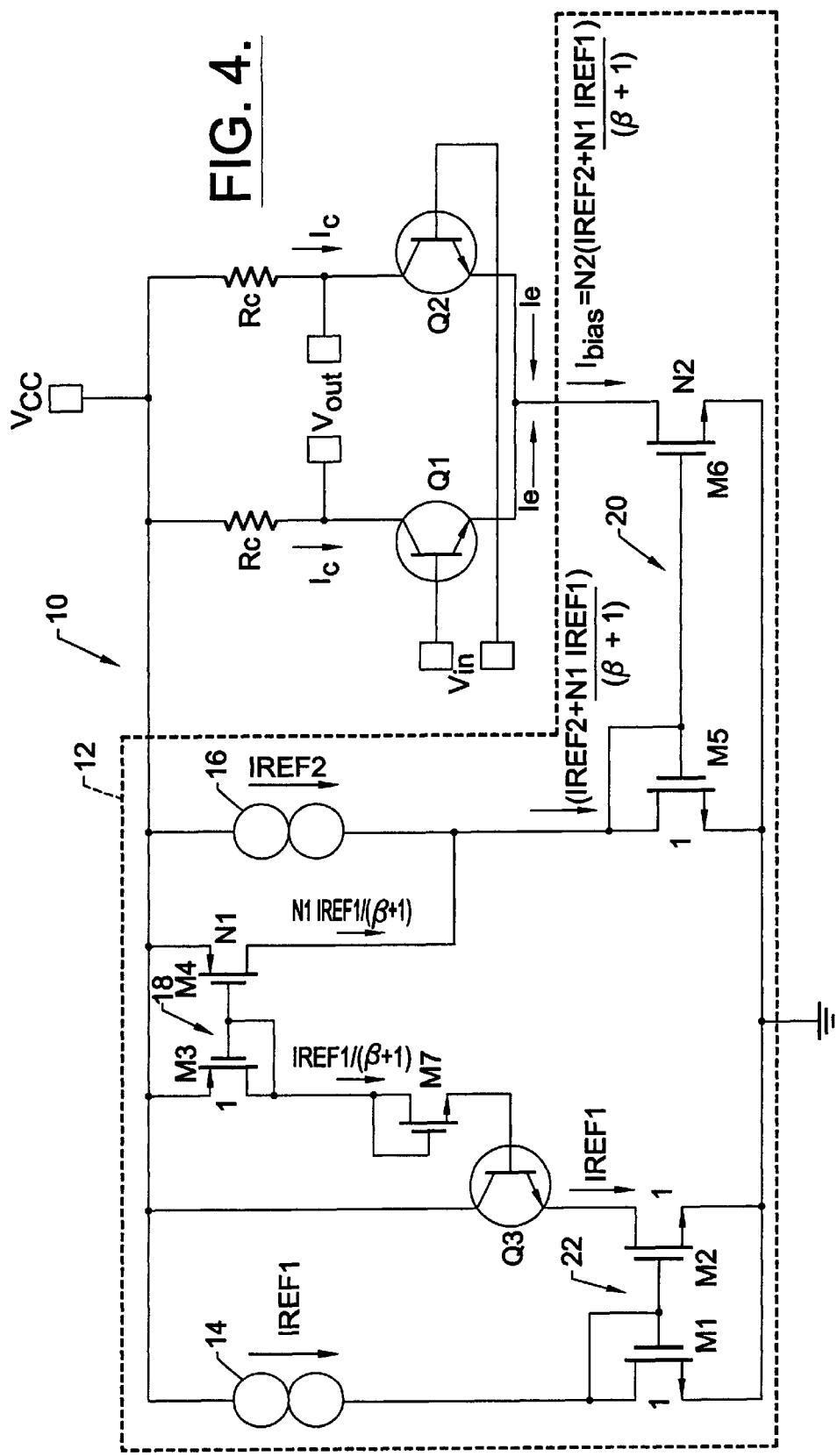
FIG. 4 is an electrical schematic of an ECP differential amplifier according to a preferred embodiment of the present invention.

Referring now to FIG. 4, a preferred differential amplifier 10 includes first and second bipolar transistors Q1 and Q2 electrically coupled together as an emitter-coupled pair (ECP). As illustrated, the collector of the first bipolar transistor QI is connected to an output node and to a power supply signal line Vcc by a first collector resistor $R_c$. Similarly, the collector of the second bipolar transistor Q2 is connected to another output node and to the power supply signal line Vcc by a second collector resistor $R_c$. The base electrodes of the first and second bipolar transistors Q1 and Q2 are also electrically connected to respective input nodes. As will be understood by those skilled in the art, the differential voltage gain of the differential amplifier may be expressed as Vout/Vin. The collector, base and emitter currents $I_c$, $I_b$ and $I_e$ in the first and second bipolar transistors Q1 and Q2 are related by the following expressions:

$$\beta I_b = I_c \tag{2}$$

$$(\beta+1)I_b = I_e \tag{3}$$

where $\beta$ is the current gain of the first and second bipolar transistors Q1 and Q2.

A biasing circuit 12 is also provided to establish a desired quiescent emitter current $I_e$ in each of the first and second bipolar transistors Q1 and Q2. In particular, the biasing circuit 12 preferably sets a bias current $I_{bias}$ at a level defined by the following expression:

$$I_{bias} = N2(IREF_2 + (N1)IREF_1/(\beta+1)) \tag{4}$$

where $IREF_1$ and $IREF_2$ are the magnitudes of the first and second reference currents provided by first and second current sources 14 and 16, and N1 and N2 are the current gains of first and second current mirrors 18 and 20, respectively, as explained more fully hereinbelow. When the value of $(N1)(IREF_1)$ is set to a level equal to $IREF_2$, the above equation can be simplified to:

$$I_{bias} = 2(I_e) = K(1+1/(\beta+1)) = K(\beta+2)/(\beta+1) \tag{5}$$

where K equals $(N2)(IREF_2)$. Substituting equation (5) into equation (1) yields an expression for the voltage gain of the preferred differential amplifier 10 which is a relatively weak function of $\beta$, even for small $\beta$:

$$A_v = \frac{1}{2}(R_c K/V_t)(\beta^2+2\beta)/(\beta^2+2\beta+1) \tag{6}$$

Referring still to the biasing circuit 12 of FIG. 4, the first current source 14 provides a constant first reference current $IREF_1$ to a preliminary NMOS current mirror 22 having first and second NMOS transistors M1 and M2 and a gain that may be set to unity. The drain of NMOS transistor M2 is electrically connected to an emitter of a third bipolar transistor Q3 that has the same p as the first and second bipolar transistors Q1 and Q2. To establish the $1/(\beta+1)$ current compensation illustrated by equation (5), the base electrode of the third bipolar transistor Q3 can be used as a reference current sink to a first current mirror 18 which comprises PMOS transistors M3 and M4 and has a gain equal to N1. An NMOS transistor M7 is also provided and configured as a resistor to set the drain voltage of NMOS transistor M2 at a desired quiescent level.

As illustrated, the first current mirror 18 generates a compensation current having a value equal to:

$$(N1)IREF_1/(\beta+1) \tag{7}$$

This compensation current is combined with the second reference current $IREF_2$ provided by the second current source 16 and then amplified by the second current mirror 20 to provide the bias current illustrated by equation (4).

Figure 1:
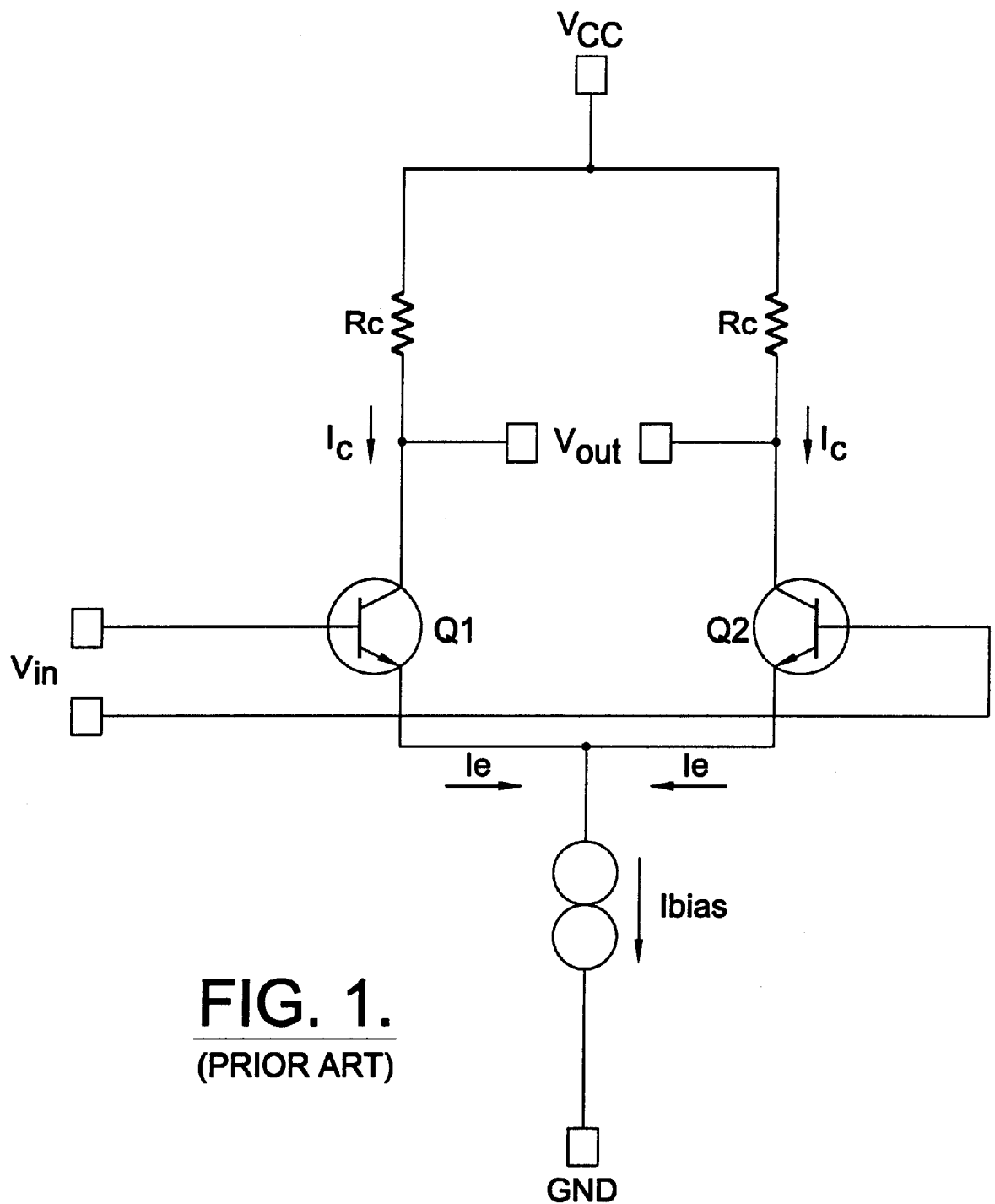
FIG. 1 is an electrical schematic of a conventional emitter coupled pair (ECP) differential amplifier.
Figure 2:
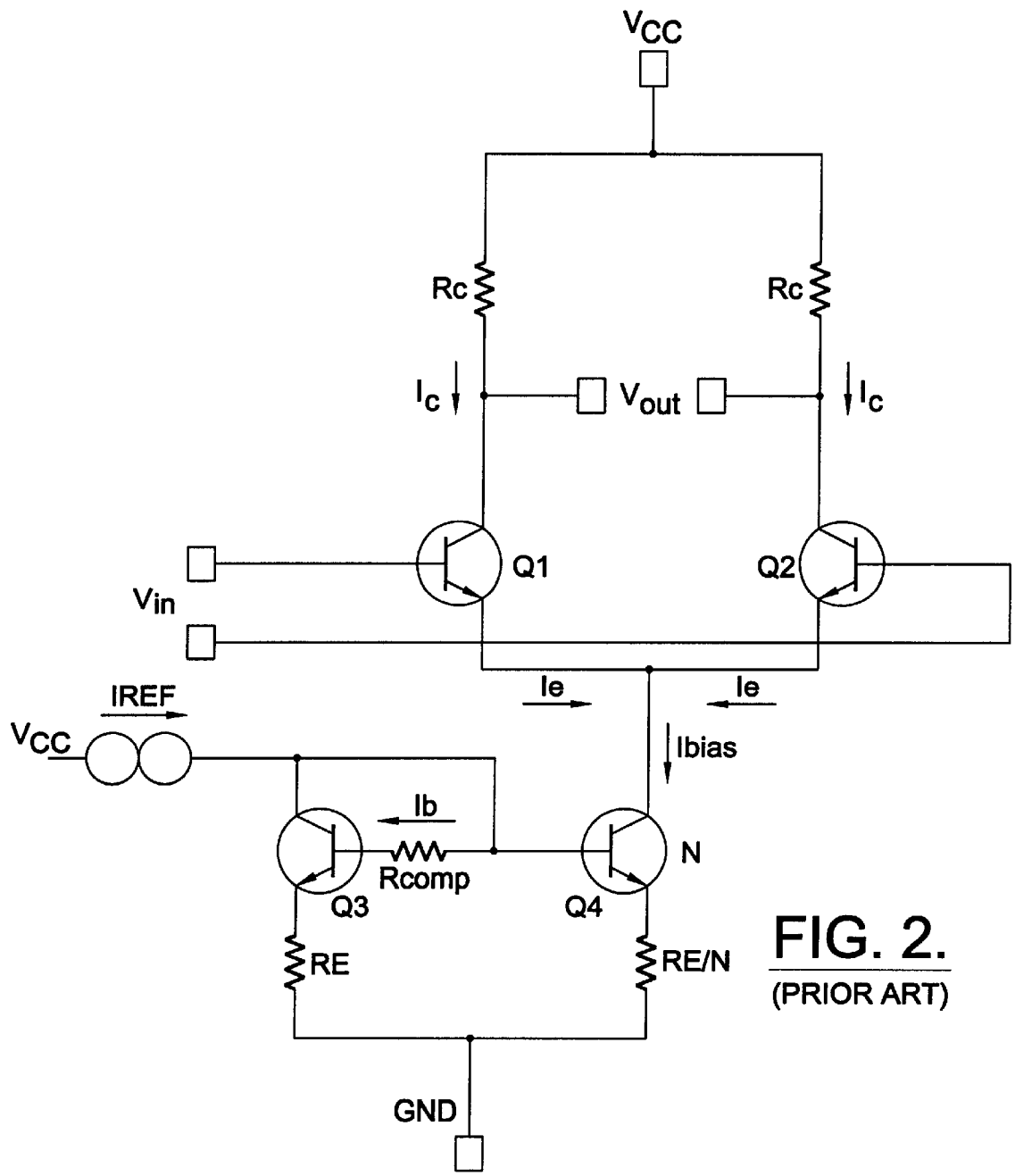
FIG. 2 is an electrical schematic of a conventional ECP differential amplifier that utilizes a resistor within a bipolar current mirror to provide beta compensation.
Figure 3:
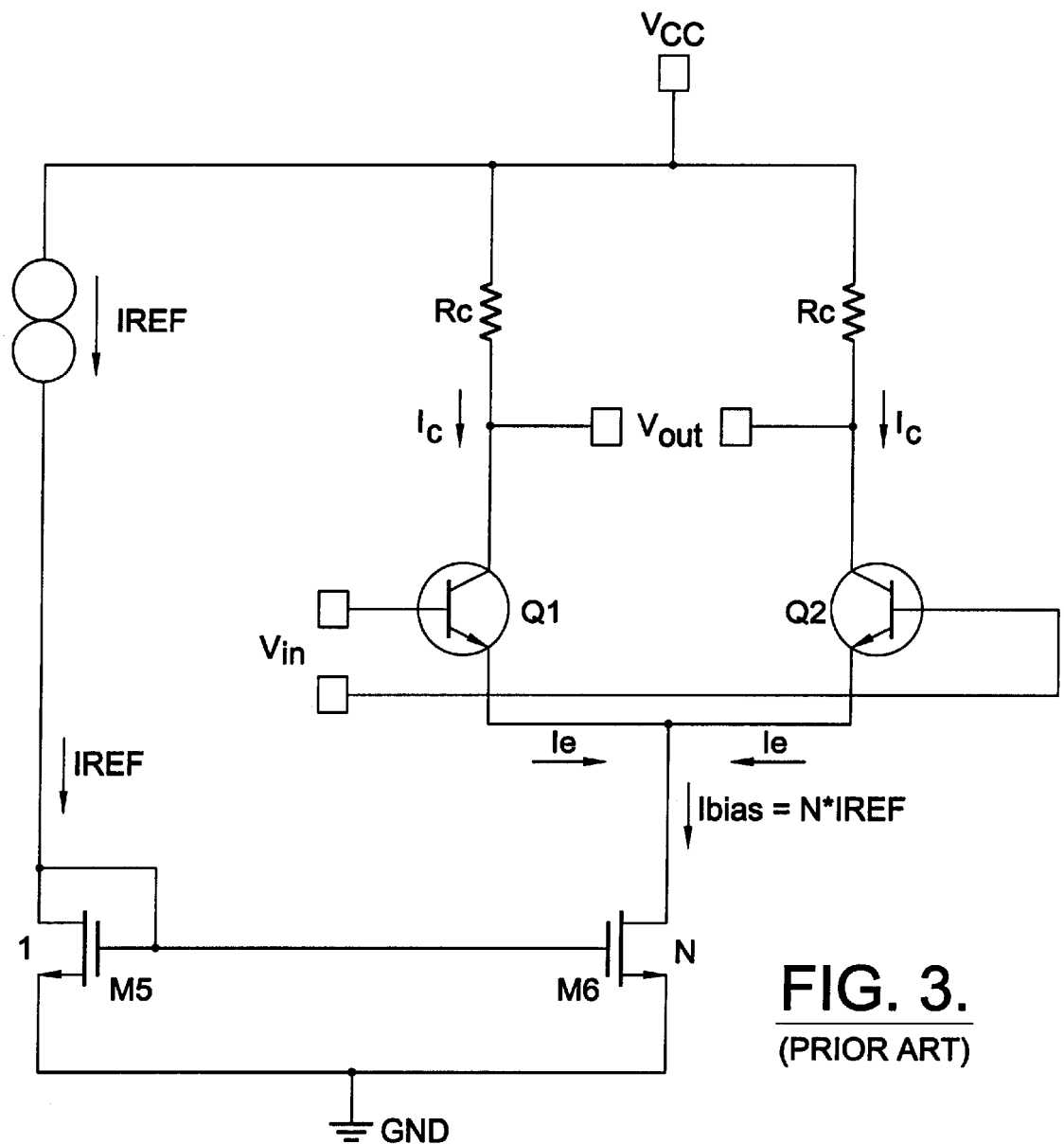
FIG. 3 is an electrical schematic of a conventional ECP differential amplifier that includes a MOS-based current mirror therein.
Figure 5:
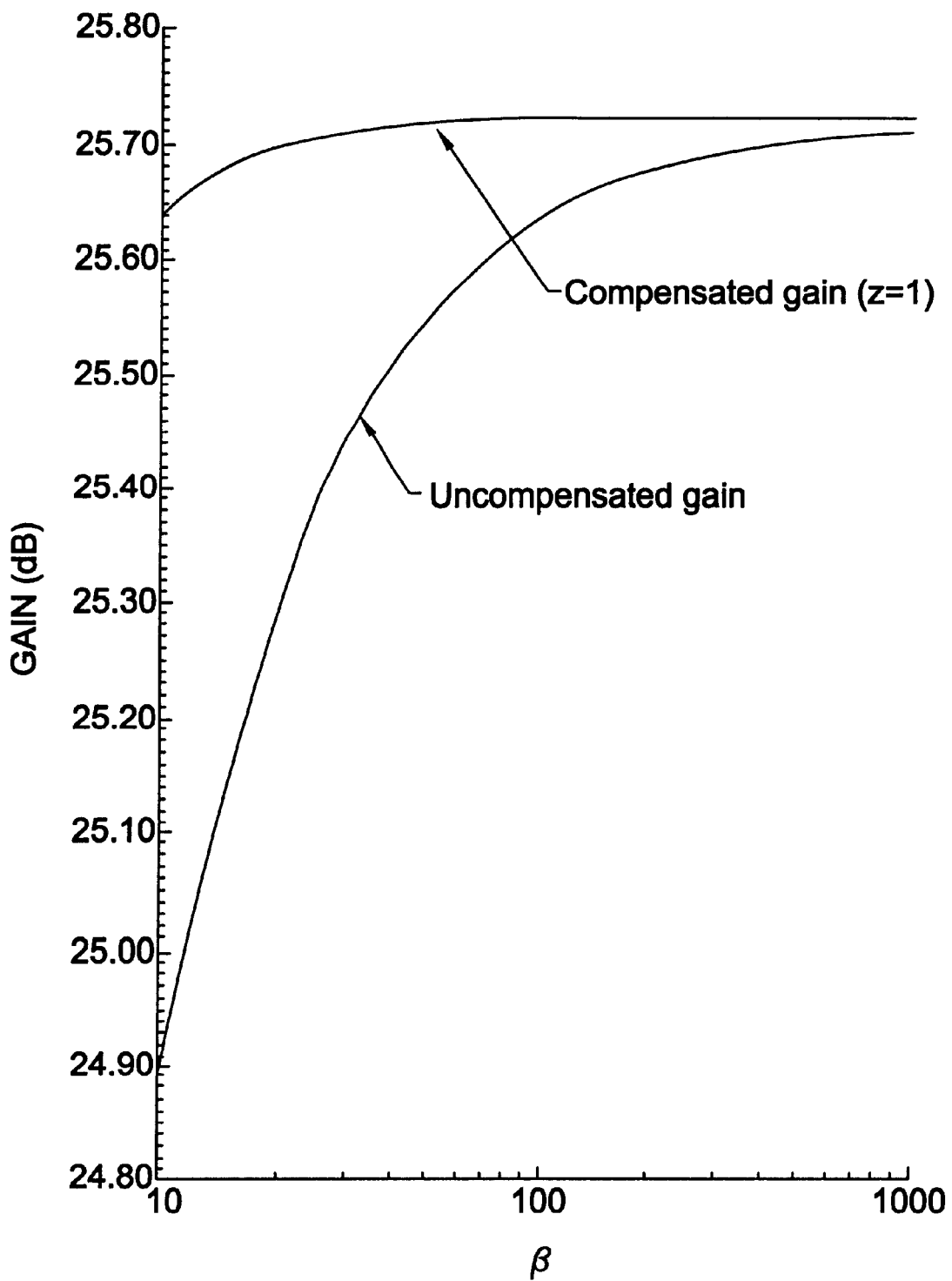
FIG. 5 is plot of emitted coupled pair gain versus beta for an ECP differential amplifier having uncompensated gain and preferred compensated gain.

Referring now to FIG. 5, a plot is provided of simulated gain (dB) versus beta for an ECP differential amplifier having uncompensated gain (FIG. 1) and an ECP differential amplifier having compensated gain (FIG. 4). This plot illustrates how the biasing circuit 12 of FIG. 4 can be utilized to reduce fluctuations in voltage gain when variations in beta occur in response to temperature and/or processing changes.

Selecting a value of $(N1)(IREF_1)$ which is not equal to $IREF_2$ may also be used advantageously to further reduce an error associated with the voltage gain of the differential amplifier over a range of $\beta$, where the error is defined as $I_c(desired) - I_c(actual)$. In particular, equation (5) may be rewritten as:

$$I_{bias} = 2(I_e) = (N2)(IREF_2)(1+N1 (IREF_1/IREF_2)/(\beta+1)) \tag{8}$$

From equation (8), an equation for the collector current $I_c$ may be expressed as:

$$I_c = (I_e^*)(\beta^2+\beta(1+Z)/(\beta^2+2\beta+1)) \tag{9}$$

where $I_e^* = \frac{1}{2} (N2)(IREF_2)$ and $Z = N1 (IREF_1/IREF_2)$. Assuming an ideal condition where $I_c = I_e^*$ (when $\beta = \infty$), then a percentage gain error can be defined as:

$$\% \text{ ERROR} = 1 - (\beta^2+\beta(1+Z)/(\beta^2+2\beta+1)) \tag{10}$$

Figure 6:
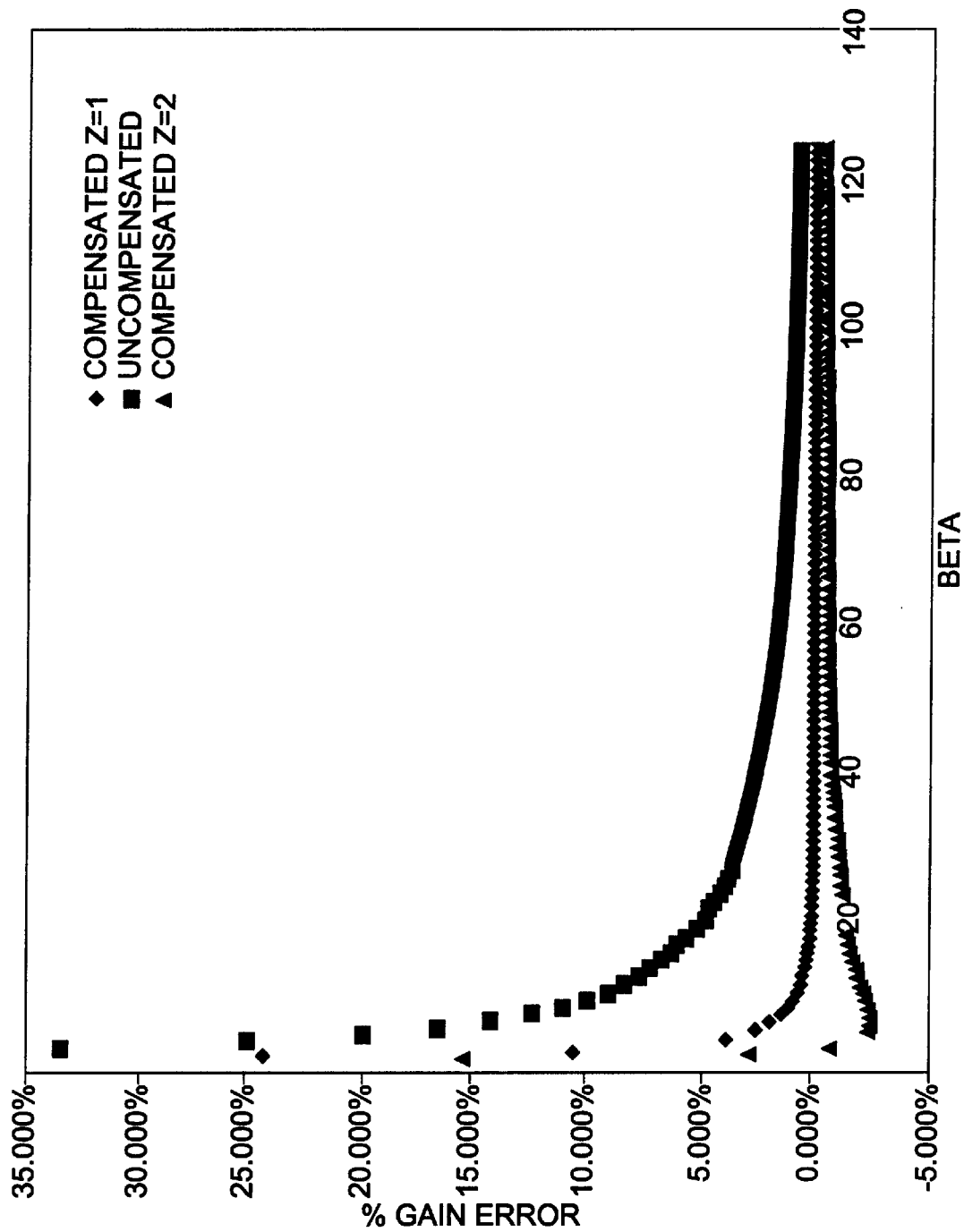
FIG. 6 is a plot of percentage gain error as a function of beta for an ECP differential having uncompensated gain and preferred compensated gain.

Referring now to FIG. 6, a plot of percentage gain error as a function of $\beta$ is provided for cases where no beta compensation is provided and for cases where beta compensation is provided by establishing Z=1 and Z=2. As illustrated, establishing the quantity of $1 < (N1 (IREF_1)/IREF_2) \leq 2$ provides significant reductions in gain error relative to the uncompensated case.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A differential amplifier, comprising:
   first and second bipolar transistors electrically coupled together as an emitter-coupled pair; and
   a biasing circuit that is electrically connected to first and second emitters of said first and second bipolar transistors, respectively, and sets a magnitude of an emitter bias current in the first emitter at a value proportional to $(\beta+Z+1)/(\beta+1)$, where $\beta$ is the gain of said first bipolar transistor and $1 \leq Z \leq 2$.

2. The differential amplifier of claim 1, wherein said biasing circuit comprises:
   a first current mirror that generates a compensation current having a magnitude that is a function of $1/(\beta+1)$; and
   a second current mirror that receives the compensation current and sets the magnitude of the emitter bias current at a level which is a function of the compensation current.

3. The differential amplifier of claim 2, wherein said biasing circuit further comprises:
   a preliminary current mirror that generates a first reference current; and
   a third bipolar transistor having an emitter electrically coupled to said preliminary current mirror and a base electrically coupled to said first current mirror.

4. The differential amplifier of claim 3, wherein said third bipolar transistor sinks a base current having a magnitude proportional to the compensation current.

5. The differential amplifier of claim 3, wherein said third bipolar transistor sinks a base current having a magnitude equal to $1/N1$ times the compensation current, where $N1$ is a gain of said first current mirror.

6. The differential amplifier of claim 5, further comprising a MOS resistor electrically connected to said first current mirror and the base of said third bipolar transistor.

7. The differential amplifier of claim 6, wherein said preliminary current source and said second current source each comprise an NMOS current source; and wherein said first current source comprises a PMOS current source.

8. A differential amplifier, comprising:
   first and second bipolar transistors electrically coupled together as an emitter-coupled pair;
   first and second current sources that generate a first reference current ($IREF_1$) and a second reference current ($IREF_2$), respectively;
   a first current mirror that generates a compensation current having a magnitude proportional to $IREF_1/(\beta+1)$, where $\beta$ is the gain of said first bipolar transistor; and
   a second current mirror that is electrically connected to first and second emitters of said first and second bipolar transistors, respectively, and sets a magnitude of an emitter bias current in the first emitter at a level proportional to $(IREF_2+(N1)(IREF_1/(\beta+1)))$, where $N1$ is a current gain of said first current mirror.

9. The differential amplifier of claim 8, wherein $N1$ equals $IREF_2/IREF_1$.

10. The differential amplifier of claim 8, wherein $N2$ is a current gain of said second current mirror; and wherein the magnitude of the emitter bias current is set at a level proportional to $N2$.

11. The differential amplifier of claim 10, wherein $IREF_1$ is less than $IREF_2$.

12. A differential amplifier, comprising:
   first and second bipolar transistors electrically coupled together as an emitter-coupled pair; and
   a biasing circuit electrically connected to first and second emitters of said first and second bipolar transistors, respectively, said biasing circuit comprising:
   first and second current sources that generate a first reference current ($IREF_1$) and a second reference current ($IREF_2$), respectively;
   a first current mirror that generates a compensation current having a magnitude proportional to $IREF_1$; and
   a second current mirror that is electrically connected to first and second emitters of said first and second bipolar transistors, respectively, and sets a magnitude of an emitter bias current in the first emitter at a level proportional to a sum of $IREF_2$ and a magnitude of the compensation current.

13. The differential amplifier of claim 12, wherein said biasing circuit further comprises:
   a preliminary current mirror that mirrors the first reference current; and
   a third bipolar transistor having an emitter electrically coupled to said preliminary current mirror and a base electrically coupled to said first current mirror.

14. The differential amplifier of claim 13, wherein said third bipolar transistor has a gain $\beta$ which is equal to a gain of said first bipolar transistor and sinks a base current having a magnitude proportional to the compensation current.

15. The differential amplifier of claim 13, wherein said third bipolar transistor sinks a base current having a magnitude equal to $1/N1$ times the compensation current, where $N1$ is a gain of said first current mirror.

16. The differential amplifier of claim 15, further comprising a MOS resistor electrically connected to said first current mirror and to the base of said third bipolar transistor.

17. The differential amplifier of claim 16, wherein said preliminary current source and said second current source each comprise an NMOS current source; and wherein said first current source comprises a PMOS current source.

18. A differential amplifier, comprising:
   first and second bipolar transistors electrically coupled together as an emitter-coupled pair; and
   a biasing circuit that is electrically connected to first and second emitters of said first and second bipolar transistors, respectively, and sets a magnitude of a voltage gain of the differential amplifier at a level proportional to $(\beta^2+(Z+1)\beta)/(\beta^2+2\beta+1)$, where $\beta$ is the gain of said first bipolar transistor and $1 \leq Z \leq 2$.

19. The differential amplifier of claim 18, wherein said biasing circuit comprises:
   a first current mirror that generates a compensation current having a magnitude that is a function of $\beta$; and
   a second current mirror that is electrically connected to said first and second bipolar transistors and to said first current mirror and sinks a bias current having a magnitude proportional to a sum of the compensation current and a reference current provided by a constant current source.

20. A method of operating a differential amplifier, comprising: biasing emitters of first and second bipolar transistors electrically coupled together as an emitter-coupled pair with a current having a magnitude proportional to $(\beta+Z+1)/(\beta+1)$, where $\beta$ is the gain of the first and second bipolar transistors and $1 \leq Z \leq 2$.

21. A differential amplifier, comprising:
   first and second bipolar transistors electrically coupled together as an emitter-coupled pair and having respective current gains equal to $\beta$; and
   means, electrically connected to first and second emitters of said first and second bipolar transistors, respectively, for setting a magnitude of a voltage gain of the differential amplifier at a level proportional to $(\beta^2+1(1+Z))/(\beta^2+2\beta+1)$ by establishing a bias current in the first and second emitters that is proportional to $(\beta+Z+1)/(\beta+1)$, where $1 \leq Z \leq 2$.

* * * * *

UNITED STATES PATENT AND TRADEMARK OFFICE
CERTIFICATE OF CORRECTION

PATENT NO.    : 6,323,732 B1
DATED         : November 27, 2001
INVENTOR(S)   : Angell et al.

It is certified that error appears in the above-identified patent and that said Letters Patent is hereby corrected as shown below:

<u>Title page,</u>
Item [57], ABSTRACT,
Line 15, please change "$(\beta_2+2\beta+1)$" to -- $(\beta^2+2\beta+1)$ --

Signed and Sealed this

Eighteenth Day of June, 2002

Attest:

Attesting Officer

JAMES E. ROGAN
*Director of the United States Patent and Trademark Office*